United States Patent [19]
Sen et al.

[11] Patent Number: 5,304,743
[45] Date of Patent: Apr. 19, 1994

[54] MULTILAYER IC SEMICONDUCTOR PACKAGE

[75] Inventors: Bidyut K. Sen, Milpitas; Eric S. Tosaya, Fremont, both of Calif.

[73] Assignee: LSI Logic Corporation, Milpitas, Calif.

[21] Appl. No.: 881,955

[22] Filed: May 12, 1992

[51] Int. Cl.⁵ ............................................. H05K 1/00
[52] U.S. Cl. ................................................. 174/262
[58] Field of Search ............... 174/262, 263, 264, 265, 174/266; 361/397, 409, 414

[56] References Cited

U.S. PATENT DOCUMENTS 4,281,361  7/1981  Patz et al. .
4,694,121  9/1987  Ota .
4,996,391  2/1991  Schmidt .

Primary Examiner—Leo P. Picard
Assistant Examiner—Cheryl R. Figlin
Attorney, Agent, or Firm—Townsend and Townsend Khourie and Crew

[57] ABSTRACT

An improved multilayer integrated circuit package. The package, which has a plurality of layers of conducting leads, has metal vias which connects leads in a first layer connected to leads in a second layer. The improvement comprises having at least one of the vias with a cross-section such that the via is much larger in a first direction than in a second direction generally perpendicular to said first direction.

7 Claims, 2 Drawing Sheets

MULTILAYER IC SEMICONDUCTOR PACKAGE

BACKGROUND OF THE INVENTION

This patent application is related to packaging of integrated circuits and, more specifically, to multilayer integrated circuit packaging.

After the processing of a semiconductor wafer is complete, the individual integrated circuit units, or die, are separated and encased in some form of packaging so that the integrated circuit can be safely handled and mounted in an electrical system. The integrated circuit package has conducting wire leads which are connected by wires to bonding pads on the integrated circuit in the interior of the package. Connected to the outside of the package, the wire leads provide a path for communicating with the encased integrated circuit.

Among the various types of packages are multilayer packages. Such packages are useful for integrated circuits having a large number of bonding pads and therefore requiring a large of number of conducting leads. Such integrated circuits include microprocessors, gate array, and other kinds of ASICs (Application Specific Integrated Circuit), which therefore require a large number of conducting leads.

A common problem in semiconductor packaging technology is the noise generated by simultaneously switching signals, such as those on a data bus, by the adjacent leads. For example, it is common that the amount of current in a lead to rise or drop 75 milliamperes in magnitude within 1 nanosecond. With parasitic inductive coupling, particularly between power/ground leads and adjacent leads, signal switching on one lead can cause spurious voltages, i.e., noise, to be generated on the adjacent leads of the package. These spurious voltages lead to the sensing of erroneous signals on the adjacent leads.

Various solutions have long been sought to avoid these problems. Among the solutions have been the design of the integrated circuit to slow down the slew rate of the driver circuits to avoid deleterious noise from outgoing signals from the integrated circuit. However, this is not an optimal solution because the integrated circuit is slowed. Generally the faster the operation of an electrical system, the better the system.

Other solutions have included reducing the number of simultaneously switching output signals, increasing the distance between switching leads, providing more power and ground pins, adding large "deadpanning" capacitors, deskewing the switching bus and so forth.

On the other hand, the present invention solves or substantially mitigates this problem without any of these drawbacks and permits the integrated circuit in its package to operate effectively at high switching speeds.

SUMMARY OF THE INVENTION

The present invention provides for an improved multilayer integrated circuit package. The package, which has a plurality of layers of conducting leads, has metal vias which connects leads in a first layer connected to leads in a second layer. The improvement comprises having at least one of the vias with a cross-section such that the via is much larger in a first direction than in a second direction generally perpendicular to said first direction.

BRIEF DESCRIPTION OF THE DRAWINGS

A more detailed understanding of the present invention may be attained by a perusal of the following Detailed Description of Preferred Embodiment(s) with reference to the following drawings.

DETAILED DESCRIPTION OF PREFERRED EMBODIMENT(S)

Figure 1:
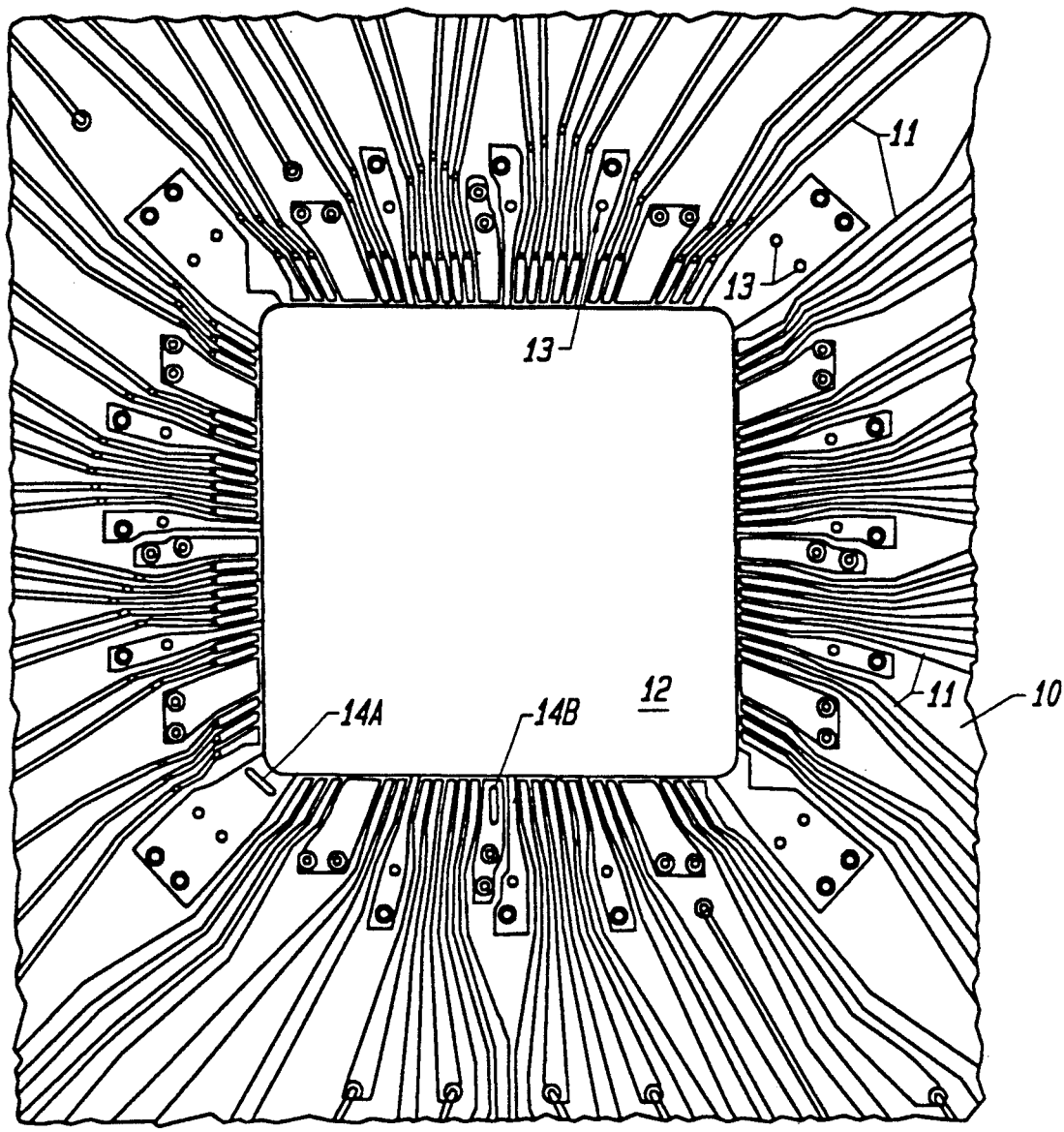
FIG. 1 is a top view of a portion of a single layer in multilayer integrated circuit package.

FIG. 1 is a top view of a portion of an exemplary single layer of a multilayer integrated circuit package. Typically these layers are made from ceramic material with different conducting metallic materials formed on the ceramic layer. The multilayer package typically has two or more of these layers with conducting leads sandwiched between a top and bottom layer to complete the package.

However, it should be noted that this invention is not limited to ceramic packaging only, but is applicable to packaging using thick and thin films, PCB materials such as FR4, polyimides such as Kapton and Upiplex, and other combinations of dielectric and conducting materials.

As shown in FIG. 1, a multitude of conducting leads 11 on a ceramic substrate 10 surround a central cavity 12. The cavity 12 receives an integrated circuit and wire leads are bonded between the ends of the conducting leads 11 and the bonding pads on the integrated circuit. The conducting leads 11 lead to the exterior of the package. Again, it should be noted that the present invention is not limited to wire bonding, but is equally applicable to TAB, flip-chip, and other types of die-to-package interconnects.

As can be seen in FIG. 1, the leads 11 are tightly packed around the cavity 12. Hence additional leads on other ceramic layers are used to provide access for electrical signals to and from the integrated circuit. The conducting leads on different layers are connected by vias through the ceramic material. Heretofore these vias have been circular or square in cross-section. Such circular vias are shown by vias 13. For conducting leads which carry large currents, multiple parallel-connected vias in close proximity are used to reduce the current density through each via. Such multiple parallel-connected vias are in FIG. 1 by vias 15. Of course, to reduce the complexity of the drawing, it should be noted that not all of the via 13 and 15 are shown in FIG. 1.

However, while reducing the problem of current density and increased path resistance, the parallel-connected vias still have the problems faced by single vias, i.e., large parasitic inductances. Moreover, the parallel-connected connected vias offer increased capacitance thereby slowing signals on the paths.

In contrast, the present invention uses vias which have relatively low parasitic inductances and resistances. FIG. 1 shows two vias 14A and 14B according to the present invention. Via 14A is placed such that, in a crosssectional view, its long axis is generally perpendicular to the longitudinal axis of the conducting lead, while via 14B has its cross-sectional long axis generally perpendicular with the axis of the conducting lead.

In accordance with the present invention, vias, as seen in a cross-sectional top view, are much larger in one direction compared to a direction perpendicular to the first direction. This allows each via to have a large total cross-sectional area to lower the impedance of the via, while insuring that no voids are created in the via during the manufacturing process of the package. In ceramic packaging, for example, vias are formed in through-holes in an intermediate ceramic sheet to connect leads on different ceramic sheets. The through-hole is filled with a paste from a metal, such as tungsten. Then the ceramic sheet is fired, along with the rest of the package. If the through-hole is too large, undesirable voids are formed in the resulting metal via after firing. With the present invention, the shorter axis of the via cross-section in a ceramic package is kept at less than 10 mils. This ensures that the through-hole is properly filled by the metallic paste and no voids are formed in the via. The via is solid.

Figure 2:
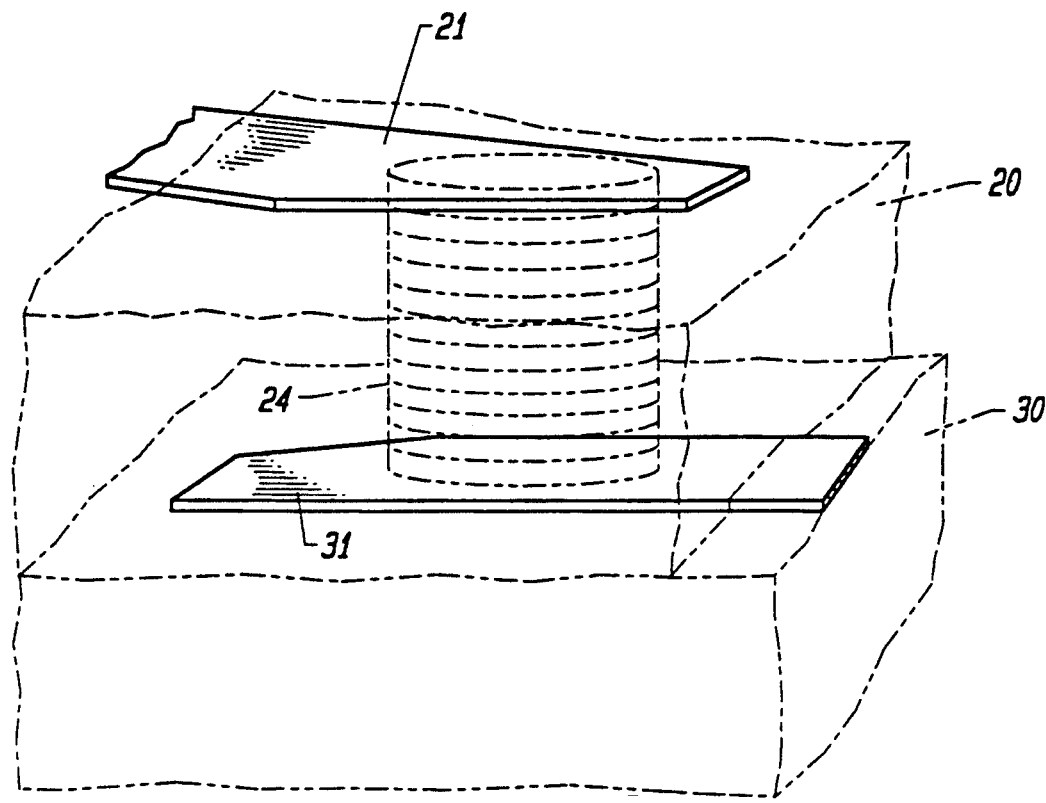
FIG. 2 is an idealized prospective view of a via connecting two leads on separate layers of a multilayer package.

FIG. 2 illustrates a via according to the present invention. A via 24 having an elongated oval cross-section connects a lead 21 on a layer 20 to a lead 31 on a second layer 30. Each lead 21 and 31 is part of a large number of leads formed respectively on the layers 20 and 30. The via 24 is formed through the layer 20. Besides two leads, a via in accordance with the present invention could connect two conducting planes, or a lead and a plane on separate layers equally well.

With the large cross-sectional area, a via according to the present invention has a lower resistance than a standard via. Contact resistance, i.e., resistance of the interface between the via and the lead, is also lowered. Compared to parallel-connected vias, a via according to the present invention has a much lower capacitance. These improvements lower the parasitic RC time constants for faster signal switching speeds.

Furthermore, a via in accordance with the present invention reduces parasitic inductance. The via shape allows the via to be placed much closer to the end of a lead, such as those for power and ground, compared to multiple parallel-connected vias. This shortening of lead lengths reduces inductance which permits an integrated circuit package with higher performance. With the reduction in the inductance of the power and ground leads, for example, the ground bounce immunity of the package improves. The package is able to handle a greater number of switching outputs, or stated differently, does not require as many power and ground pins. More powerful or faster output buffers may be supported in the package.

Finally, besides lower parasitic inductance, lower resistance through the via, lower contact resistance, the present invention provides for better shielding, or isolation, of the conducting leads in the package. In multilayer packages many of the layers are formed from power and ground planes to provide various access to power and ground. It is desirable that the power planes be connected together by large connections to handle the heavy currents through these planes generated by the signal switching of the packaged integrated circuit in as many locations as possible. This is also true for the ground planes with connections passing through holes in the vias of opposite type.

With large circular and square vias, it is difficult to make these connections at as many and specific locations as desired. With vias according to the present invention, on the other hand, these connections can be conveniently made at desired locations. These connections provide shielding for the signals on the leads 11, which are located on layers between the power and ground plane layers.

This shielding of signals can be seen from a side cross-sectional view of the package, which intersects any two planar connections. From this view any leads between the planar connections appear to be surrounded by a continuous band of conducting material. In other words, in a side crosssectional view, the leads appear to form part of a coaxial cable. Thus the leads are shielded. Furthermore, the vias according to the present invention have long axes which may be aligned to enhance the effect of a coaxial cable.

Figure 3A:
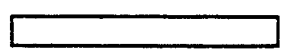
FIGS. 3A-3F are cross-sectional top views of vias according to various embodiments the present invention.
Figure 3D:
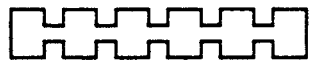
Figure 3B:
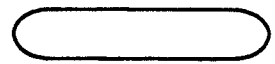
Figure 3E:
Figure 3C:
Figure 3F:

FIGS. 3A-3F illustrate various cross-sectional top views of vias according to the present invention. The via in FIG. 3A is simply a long rectangle. The FIG. 3B via is a long oblong. In FIG. 3C the via is a series of interconnected circles. This shape allows the circular punch which is presently used to create vias to be used. The FIG. 3D via is a series of interconnected rectangles of different sizes. The rectangles are generally aligned along their long axes. This shape allows two differently sized rectangular punches to be used to create vias according to the present invention. In FIG. 3E the via is a series of circles interconnected by rectangles. As in the via of FIG. 3D the interconnecting rectangles are generally aligned along their long axes. This is also true for the via illustrated in FIG. 3F. The interconnecting rectangles link is a series of oblongs which also have their long axes generally aligned with the axes of the rectangles.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. An improved multilayer integrated circuit package, said package having a plurality of layers of conducting leads, at least one of said leads in a first layer connected to a lead in a second layer by a metal via, the improvement comprising said via having a cross-section such that said via is much larger in a first direction than in a second direction perpendicular to said first direction and said via cross-section is in the shape of overlapping circles.

2. An improved multilayer integrated circuit package, said package having a plurality of layers of conducting leads, at least one of said leads in a first layer connected to a lead in a second layer by a metal via, the improvement comprising said via having a cross-section such that said via is much larger in a first direction than in a second direction perpendicular to said first direction and said via cross-section is in the shape of interconnected rectangles.

3. The improved multilayer integrated circuit as in claim 2 wherein said interconnected rectangles are generally aligned along their long axes.

4. An improved multilayer integrated circuit package, said package having a plurality of layers of conducting leads, at least one of said leads in a first layer connected to a lead in a second layer by a metal via, the improvement comprising said via having a cross-section such that said via is much larger in a first direction than in a second direction perpendicular to said first direction and said via cross-section is in the shape of circles interconnected by rectangles.

5. The improved multilayer integrated circuit as in claim 4 wherein said interconnecting rectangles are generaly aligned along their long axes.

6. An improved multilayer integrated circuit package, said package having a plurality of layers of conducting leads, at least one of said leads in a first layer connected to a lead in a second layer by a metal via, the improvement comprising said via having a cross-section such that said via is much larger in a first direction than in a second direction perpendicular to said first direction and said via cross-section is in the shape of oblongs interconnected by rectangles.

7. The improved multilayer integrated circuit as in claim 6 wherein said interconnecting rectangles are generaly aligned along their long axes.

* * * * *